United States Patent [19]
Lin

[11] Patent Number: 5,929,997
[45] Date of Patent: Jul. 27, 1999

[54] ALIGNMENT-MARK MEASUREMENTS ON THE BACKSIDE OF A WAFER FOR SYNCHRONOUS WAFER ALIGNMENT

[75] Inventor: S. Benjamin Lin, Taipei, Taiwan

[73] Assignee: Winbond Electronics Corp., Hsinchu, Taiwan

[21] Appl. No.: 08/887,245

[22] Filed: Jul. 2, 1997

[51] Int. Cl.[6] .................................................. G01B 11/00
[52] U.S. Cl. ............................................................. 356/401
[58] Field of Search ................................. 3565/399–401; 250/559.3, 548

[56] References Cited

U.S. PATENT DOCUMENTS 3,865,483  2/1975  Wojcik .
4,952,060  8/1990  Ina et al. .
5,048,968  9/1991  Suzuki .

*Primary Examiner*—K P Hantis
*Attorney, Agent, or Firm*—Bo-In Lin

[57] ABSTRACT

The present invention discloses a method for aligning a reticle with a semiconductor wafer. The method includes the steps of (a) applying a light source and an optical system for directing an incident light beam to a plurality of reticle alignment marks on the reticle to project a reticle-mark beam to an alignment detector therefrom; (b) applying the light source and the optical system for directing the incident light beam to a plurality of wafer alignment marks on a second surface of the wafer for projecting a wafer-mark beam therefrom wherein the second surface opposite a first surface of the wafer facing the reticle; and (c)applying the optical system for directing the wafer-mark beam to the alignment detector for precisely aligning the reticle and the wafer.

7 Claims, 2 Drawing Sheets

ALIGNMENT-MARK MEASUREMENTS ON THE BACKSIDE OF A WAFER FOR SYNCHRONOUS WAFER ALIGNMENT

BACKGROUND OF THE INVENTION

1. Field of the Invention

This invention relates generally to apparatus and process for manufacturing integrated circuits (ICs) on semiconductor wafers. More particularly, this invention relates to a novel alignment technique for aligning a semiconductor wafer with a mask or a reticle by employing an optical system which can detect the relative positions of the alignment marks disposed on the backside of the semiconductor wafer with respect to the alignment marks on a mask or a reticle to be aligned thereto.

2. Description of the Prior Art

As higher alignment precision is required for integrated circuit (IC) manufacture to produce ICs with ever shrinking line widths operated at higher speed while providing greater degree of functional integration, the difficulties to accurately and clearly detect and measure the positions of the alignment marks on a wafer often become a limitation to further miniaturize the IC devices. The difficulties arise from the fact the alignment marks on a wafer employed for relative position measurements are often smeared or stained as the results of various manufacturing processes. As the alignment marks become blurred and not clearly distinguishable, an alignment measurement may not be accurately performed. Specifically, the sharp and fine lines of the alignment marks may become blemished and indefinite when a planarization process is applied over the top surface of the wafer including the surface areas of these marks. The planarization step is commonly carried out by applying a chemical and mechanical polishing (CMP) process. As the CMP process is applied to the alignment marks, the fine line definition of the alignment marks may be lost and no longer suitable for the purpose of high precision alignment. Additionally, in the process of forming various circuit elements, various layers are formed over the top surface and then patterned. These process may also cause the alignment marks to become blurred and unclear thus causing difficulties and imprecision in detecting these marks for position measurement.

FIG. 1 is a functional block diagram showing the alignment system commonly employed in a conventional IC manufacturing process. The alignment system 10 includes a light source 15 for projecting an alignment beam 20 to a beam splitter 25. The alignment beam 20 is spitted into two beams with a first beam 20-1 projecting to a reticle 30 with a set of reticle alignment marks 35 formed thereon. The first alignment beam 20-1 transmitted through the reticle alignment marks and the quartz portion 30-1 of the reticle 30 to reach an alignment detector 40. In the meantime, a second alignment beam 20-2 is reflected by the beam splitter 25 to a wafer 45 supported on a wafer chuck 50. As shown in FIG. 1, the wafer includes a substrate 45-3 which has a set of wafer alignment marks 60 formed on the top surface of the substrate 45-3. The substrate 45-3 of the wafer 45 is covered by a CMP oxide layer 45 and also by a metal layer 45-1. The oxide layers 45 is transparent to allow the alignment beam 20-2 to reach the alignment marks 60 on the top surface of the substrate 45-3. The metal layer 45-1 is however not transparent to the alignment beam. Under the circumstance when a CMP process is not performed, the alignment operation would still be feasible because the alignment marks 60 on the substrate 45-3 are transferred to the metal layer 45-1. The alignment beam 25-2 is then reflected from the top surface of the substrate 45-3 and transmitted through the CMP oxide layer 45-2 and the metal layer 45-1, or directly from the alignment marks transferred to the top surface of the metal layer 45-1, to reach the alignment detector 40. The alignment beams 20-1 and 20-2 received by the alignment detector are then employed to determine the relative position of the wafer 45 relative to the reticle 30. Based the results of the relative position analysis, the position of the wafer is then adjusted by moving the wafer chuck 50 to assure precise alignment of the wafer 45 with the reticle 30. However, when a CMP process is carried out, the top surface of the metal layer 45-1 is polished thus the alignment marks which are transferred to the metal layer surface are no longer visible. A failure of the alignment operation occurs due to the fact the metal layer 45-1 blocks the alignment beam.

As discussed above, there are several ways that the alignment marks 60 on the top surface of the substrate 45-3 may become obscure and not suitable for high precision alignment operation. Specifically, since a CMP planarization process is often applied to the top surface, the marks maybe polished and become smeared and the fine lines of the marks may be spread thus unsuitable for alignment to be conducted with thin lines of very fine resolution. Furthermore, the wafer alignment marks 60 in some cases are covered by the CMP oxide layer 45-2. When the CMP oxide layer 45-2 is not formed with flat and uniform layer thickness, the optical path of the alignment beam 20-2 may be deviated from the straight line between the splitter 25 and the wafer alignment marks 60. The alignment is distorted due to this optical path deviation. Additionally, since the alignment marks 60 are covered under various layers, e.g., the oxide layer 45-2 and the metal layer 45-1, the beam intensity may be reduced as the light flux is annihilated by these different layers. Also, the wafer alignment marks 60, when covered below these layers may often become indefinite and unclear. Poor light quality is usually generated from the reflection of the alignment beam 20-2 from the top surface of the substrate 45-3 formed with the wafer alignment marks thereon. All these factors may adversely affect the quality and precision of the alignment process.

Suzuki discloses in U.S. Pat. No. 5,048,968, entitled "Alignment Mark Detecting Optical System" (issued Sep. 17, 1991), an alignment mark detecting optical system which is usable with an automatic alignment apparatus. The alignment marks of a wafer and a mask are scanned by a laser beam to detect the state of misalignment between these two sets of marks. The laser beam scans the surface of the wafer opposed to the mask and the surface of the mask opposed to the wafer, i.e., the front face of the wafer and the back face of the mask. The light beams reflected by the surfaces are introduced to one or more photo detectors. As pointed out in the patent, this alignment system provides the advantage that it can be used with an automatic alignment system and provide highly efficient operation. However, this system does not provides a solution to the difficulty that the alignment marks may become smeared due to the polishing process carried out over the surface facing the masks or the alignment beam may be obscured by the overlying layers covering the alignment marks.

A "step and repeat" type of reduction projection exposure apparatus is disclosed in U.S. Pat. No. 4,952,060 where the light sources are employed to project light beams, in two different steps, on the alignment marks of the wafer and then on the alignment marks of the reticle. The alignment system includes optical elements used for two steps, i.e., "step and repeat" alignment operation. The reticle is first aligned with a set of reference points, with the wafer removed, by a reticle alignment beam. Then this set of common reference points are employed for alignment of the wafer by applying a separate wafer alignment beam on the backside of the wafer. However, since two separate beams from two separate light sources and two separate steps are involved in the alignment, in addition to the trouble of carefully aligning the optical system with these two set of light sources, the accuracy of the alignment is also affected due to the fact the there is no comparison and matching of light beams from direct single beam alignment. The indirect relative position alignment with a set of common reference points as disclosed in this patent may not be suitable for high precision application due to the fact that it involves additional imprecision when a two step process is applied. Furthermore, the through-put of wafer production is reduced due to the additional alignment step.

Therefore, a need still exists in the art of integrated circuit manufacture to overcome this difficulty. The improved process must provide direct and precise alignment whereby the method can be applied for high precision manufacture requirements. Furthermore, it is preferable that the method can be conveniently employed without requiring complicate optical path arrangements such that calibration alignment of the optical system can be conveniently completed without time consuming process and a low production cost can be maintained.

SUMMARY OF THE PRESENT INVENTION

It is therefore an object of the present invention to provide a new alignment technique wherein the alignment accuracy is not affected by the chemical and mechanical polishing processes (CMP) applied for planarization of the wafer surface and various layers formed thereon such that wafer alignment with high level of precision can be achieved thus enabling those of ordinary skill in the art to overcome the aforementioned difficulties and limitations encountered in the prior art.

Specifically, it is an object of the present invention to provide a new wafer alignment technique by providing an optical system for detecting the alignment marks formed on the backside of the wafer and directing the reflecting beam from these marks to the alignment detector such that wafer alignment can be synchronously performed without being affected by surface topology changes made to the front surface of the wafer as results of various manufacturing processes performed thereon.

Another object of the present invention is to provide a new wafer alignment technique by providing an optical system for detecting the alignment marks formed on the backside of the wafer such that very clear and non-obscured measurement of wafer alignment marks can be provided for high precision alignment without being affected by surface topology changes made to the front surface as results of various manufacturing processes performed thereon.

Another object of the present invention is to provide a new wafer alignment technique by providing an optical system for detecting the alignment marks formed on the backside of the wafer and to simultaneously detect a corresponding set of alignment marks on a reticle and directing the beams from these two set of marks to the alignment detector such that direct wafer alignment can be synchronously performed with a single light source to achieve high precision alignment without being affected by surface topology changes made to the front surface.

Briefly, in a preferred embodiment, the present invention includes an alignment system for aligning a reticle with a semi-conductor wafer. The alignment system includes a light source for projecting an alignment beam along an incident beam axis along a zero degree direction. The alignment system further includes an alignment detector and a beam splitter for reflect a portion of the alignment beam along an optical path of ninety degree relative to the incident beam axis to a plurality of reticle alignment marks disposed on a surface of the reticle for projecting a reticle-mark beam there-through to the alignment detector. The alignment system further includes a wafer beam optical subsystem includes a plurality of reflectors for directing a portion of the alignment beam to an optical path of ninety-degree relative to the incident beam axis to irradiate on a plurality of wafer alignment marks to reflect a wafer-mark beam therefrom. The wafer beam optical subsystem further constituting a wafer-mark beam optical path for directing the wafer-mark beam reflected from the plurality of wafer marks back to the beam splitter for projecting to the alignment detector for carrying out an alignment thereby. In a preferred embodiment, the alignment system further includes a transparent wafer chuck for holding the wafer thereon and for transmitting the alignment beam there-through.

This invention further discloses a method for aligning a reticle with a semiconductor wafer. The method of alignment include the steps of (a)applying a light source and an optical system for directing an incident light beam to a plurality of reticle alignment marks on the reticle to project a reticle-mark beam to an alignment detector therefrom; (b)applying the light source and the optical system for directing the incident light beam to a plurality of wafer alignment marks on a second surface of the wafer for projecting a wafer-mark beam therefrom wherein the second surface opposite a first surface of the wafer facing the reticle; and (c)applying the optical system for directing the wafer-mark beam to the alignment detector for precisely aligning the reticle and the wafer.

These and other objects and advantages of the present invention will no doubt become obvious to those of ordinary skill in the art after having read the following detailed description of the preferred embodiment which is illustrated in the various drawing figures.

DETAILED DESCRIPTION OF THE PREFERRED EMBODIMENT

Figure 1:
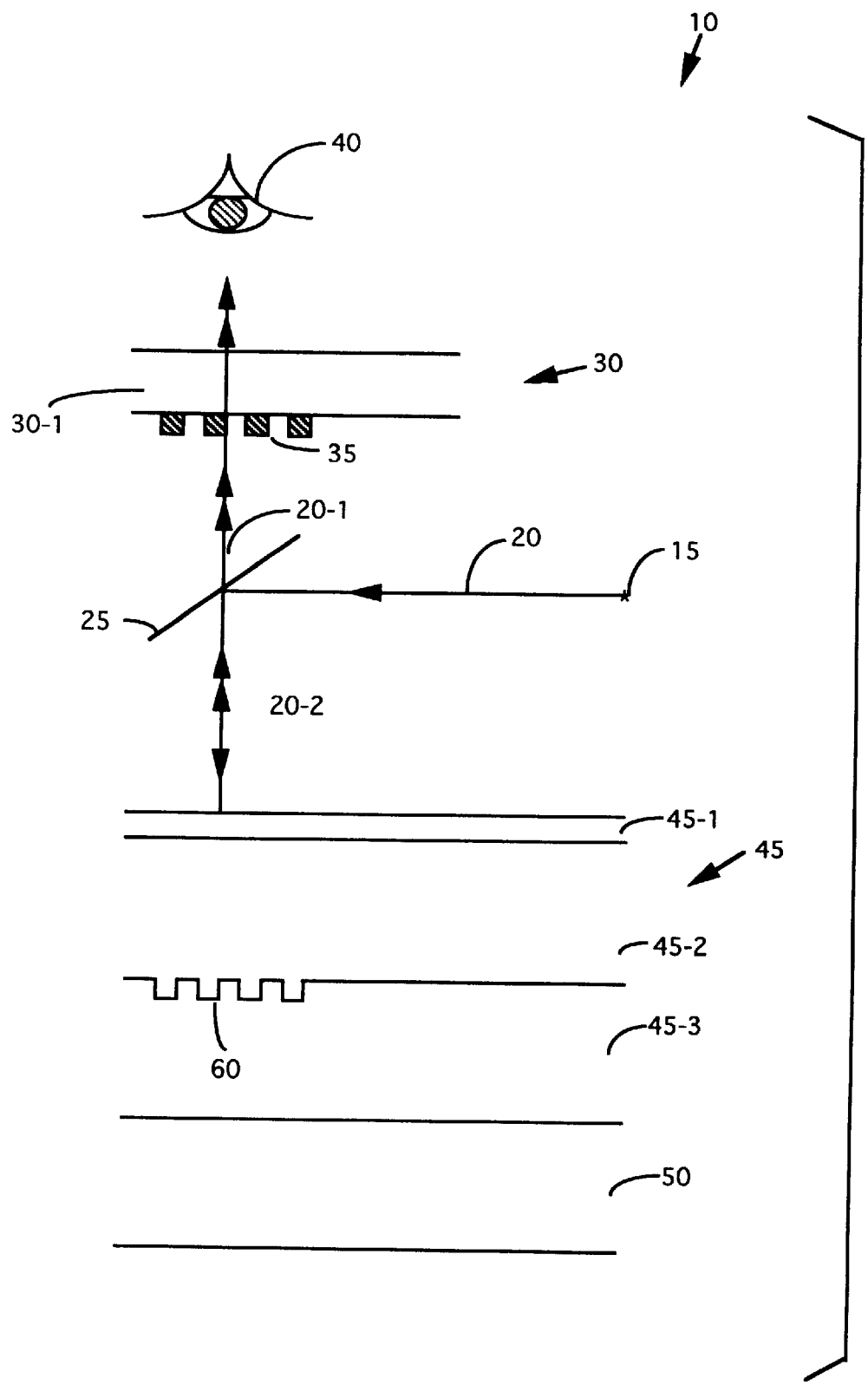
FIG. 1 is a functional block diagram showing an alignment system commonly employed in the conventional integrated circuit manufacturing processes by those of ordinary skill the prior art.
Figure 2:
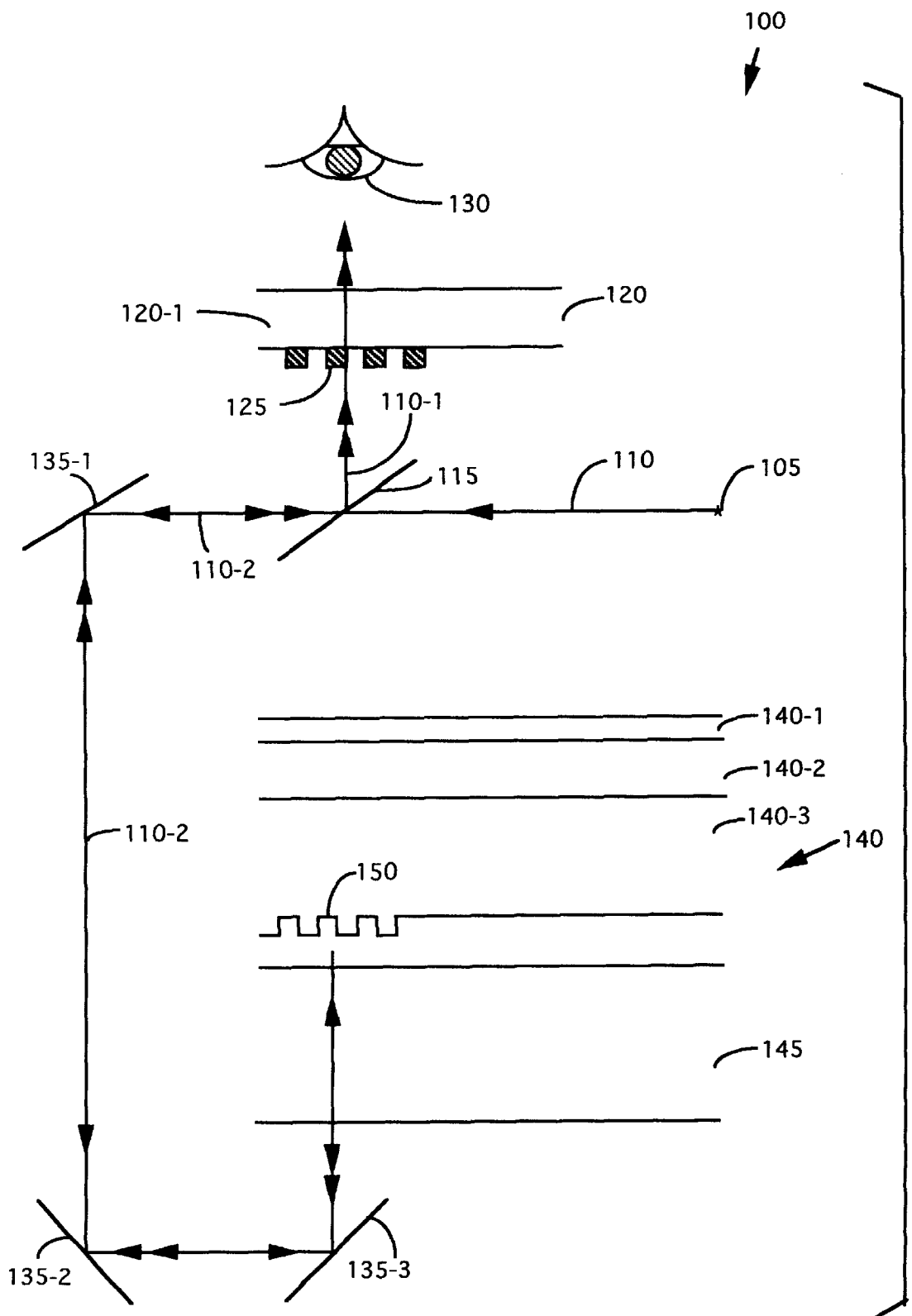
FIG. 2 is a functional block diagram showing an alignment system of this invention wherein the alignment detection is conducted to detect the alignment marks formed on the backside of a semiconductor wafer.

FIG. 2 is functional diagram showing an alignment system 100 applying a novel wafer alignment technique of the present invention. The alignment system 100 includes a light source 105 for projecting an alignment beam 110 to a beam splitter 115. The alignment beam 110 is spitted into two beams with a first beam 110-1 projecting to a reticle 120 with a set of reticle alignment marks 125 formed thereon. The first alignment beam 115-1 transmitted through the reticle alignment marks 125 and the quartz portion 120-1 of the reticle 120 to reach an alignment detector 130. In the meantime, a second alignment beam 110-2 is transmitted by the beam splitter 115 to a backside light-path guide 135 which includes a set of three reflectors 135-1, 135-2, and 135-3 to guide the alignment beam 110-s to a backside of a wafer 140 supported on a wafer chuck 145. As shown in FIG. 2, the wafer 140 includes a substrate 140-3 which has a set of wafer alignment marks 150 formed on the backside surface of the substrate 140-3. The substrate 140-3 of the wafer 140 is covered by a CMP oxide layer 140-2 and a metal layer 140-1. In this alignment system, because the alignment beam 110-2 is directed to project on the alignment marks 150 formed on the backside of the wafer 140, the alignment beam 110-2 is no longer blocked or obscured by these layers. The wafer chuck 145 is made with a transparent material such as quartz to allow the alignment beam 110-2 to irradiate upon the wafer alignment marks 150.

The alignment beam 110-2 is then reflected from the backside surface of the substrate 140-3 and transmitted through the backside light path guide 135 including three plane reflectors 135-1 to 135-3 and also reflected by the beam splitter 115 to reach the alignment detector 130. The alignment beams 110-1 and 110-2 received by the alignment detector are then employed to determine the relative position of the wafer 140 relative to the reticle 120. Based the results of the relative position analysis, the position of the wafer is then adjusted by moving the wafer chuck 145 to assure precise alignment of the wafer 140 with the reticle 120.

There are several optical techniques employed carry out the task of reticle to wafer alignment One example the techniques is a phase grating method with the basic principle illustrated in FIG. 3. Referring to FIG. 3 for illustrating the fact that a phase change of the alignment beam is generated when the alignment beam is reflected from an array of alignment marks. The magnitude of the phase change a depends on the profile depth 6 according to the following equation:

$$\alpha = (4\pi n\delta)/\lambda \quad (1)$$

where n=1, 2, . . . which is order of harmonics and λ is the wavelength of the alignment beam. When there is a periodic length P between the alignment marks, the alignment beam can only be reflected constructively in a direction θ which satisfy the relationship that:

$$P \sin\theta = n\lambda \quad (2)$$

and $$\sin\theta = n\,\lambda/P \quad (3)$$

Based on the phase changes detected by the alignment detector for the alignment beams reflected back from the alignment marks on the reticle and the wafer, the relative position between wafer and the reticle can be determined. Adjustments of the relative positions between the reticle and the wafer are then determined and carried out to achieve certain alignment precision required for the manufacture of the integrated circuits (ICs) to be implemented on the wafer. As several alignment techniques are available and each of these techniques are be employed by different companies, details descriptions of these techniques are not necessary as they are commonly known and available to those of ordinary skill in the art of IC manufacture industry. Specifically, this Patent Application incorporates by reference the methods disclosed in the publications of "Application Bulletin 04 (11/5/92)" and "Application Bulletin 12 (10/25/90)" published by ASM Lithography, and a Nikon publication of "Specification 2205EX12B-03". These publications are provided as part of Patent Application for references herein. The alignment optical system disclosed in this invention, can therefore be applied by the use of a "zero level alignment mark system", a "laser step alignment system (LSL)", a "field image alignment (FIA) system", a "laser interferometric alignment (LIA) system", or other types of techniques depending on the specific purpose of alignments and the ICs to be manufactured on the wafer.

In the first reference Application Bulletin 04 (11/5/92) published by ASM Lithograph, the mark description and specifications of zero level mark for employing a series of ASM-Lithography wafer steppers are described. The wafer steppers are production oriented integrated circuit production tools, which utilize an alignment system based on phase grafting markers on the wafer and reticle. An alignment of the wafer and the reticle marks is completed through the lens, allowing for accurate registration capabilities. The use of the zero mark technique allows the steppers to offer a specification of 0.15 micrometers error three sigma for any layer to any layer single machine overlay, and 0.25 micrometers error three sigma for any layer to any layer matched machine overlay. This tight overlay specification allows IC manufacturers to shrink their devices thus cutting production costs. The marker was designed to be process independent. The marks consist of a pattern of horizontal and vertical lines and spaces. The pitch of the line/space pairs is 16 micrometers and 1.76 micrometers. The specifications for the global marks on all wafers and the secondary marks utilized for field by field alignments are also described.

In the second reference, i.e., Application Bulletin 12 (10/25/90) published by ASM Lithography, the subject of analyzing and correcting alignment failures are discussed. Techniques of analyzing alignment signals that contain phase information to allow for precise alignment utilizing steppers provided with zero level alignment marks are discussed. The possibility of inadvertently construct film stacks during processing which may result in the partial or total extinction of the alignment illumination is examined. Under this circumstance, there would be insufficient signal intensity returns to the detector of the alignment system and misalignment or rejection of the wafer may occur. The methods for diagnosing and eliminating the causes of wafer alignment failures are presented. Different types of alignment failures and techniques of diagnosis and correction are disclosed. These techniques can be useful when the alignment system of this invention is implemented.

In the third reference, i.e. a Nikon publication of "Specification 2205EX12B-03", an alignment technique is presented. A Nikon equipment to provide one-fifth reduction projection of a reticle pattern on to a wafer through step-and-repeat operation with an excimer laser. It automatically performs reticle positioning and exposure focusing. The system also automatically performs pattern registration using laser step alignment (LSA) or field image alignment (FIA) process. Precise position adjustment of each exposure can then be accomplished by using a reticle interferometer system. The system configuration of Nikon's equipment is presented. The performance characteristics and methods of operation are also discussed. Again, the alignment equipment as presented in this publication can be implemented with the novel alignment mark measurement configuration and methods disclosed in the present invention.

Therefore, in this invention, an alignment system 100 for aligning a reticle 120 with a semiconductor wafer 140 is disclosed. The alignment system 100 includes a light source 105 for projecting an alignment beam 110 along an incident beam axis along a zero degree direction. The alignment system 100 further includes an alignment detector 130 disposed above the reticle 120. The alignment system 100 further includes a beam splitter 115 for reflect a portion of the alignment beam 110 along an optical path of ninety degree relative to the incident beam axis to a plurality of reticle alignment marks 125 disposed on a surface of the reticle 120 for projecting a reticle-mark beam there-through to the alignment detector 130. The alignment system 100 further includes a transparent wafer chuck 145 disposed directly under the reticle 120 for holding the wafer 140 thereon and for transmitting the alignment beam 110 therethrough. The alignment system 100 further includes a wafer beam optical subsystem includes three plane reflectors 135-1 to 135-3 wherein each reflector is provided for directing the alignment beam to a ninety degree direction change for directing the alignment beam 110-2 to an optical path of ninety-degree relative to the incident beam axis directly below the wafer chuck 145 to irradiate on a plurality of wafer alignment marks 150 to reflect a wafer-mark beam 110-2 therefrom. The wafer beam optical subsystem 135 further constitutes a wafer-mark beam optical path for guiding the wafer-mark beam reflected from the plurality of wafer marks 150 back to the beam splitter 125 for projecting to the alignment detector 130 for carrying out an alignment thereby.

This invention further discloses a method for aligning a reticle 120 with a semiconductor wafer 140. The method of alignment include the steps of (a)applying a light source 105 and an optical system for directing an incident light beam 110 to a plurality of reticle alignment marks 125 on the reticle 120 to project a reticle-mark beam to an alignment detector 130 therefrom; (b)applying the light source 105 and the optical system for directing the incident light beam 110 to a plurality of wafer alignment marks 150 on a second surface of the wafer 140 for projecting a wafer-mark beam therefrom wherein the second surface opposite a first surface of the wafer 140 facing the reticle 120; and (c)applying the optical system for directing the wafer-mark beam to the alignment detector 130 for precisely aligning the reticle 120 and the wafer 140.

In summary, this invention also discloses a semiconductor wafer 140 which includes a first surface for forming a plurality of integrated circuits (IC) elements thereon. The wafer 140 also includes a second surface opposite the first surface wherein the second surface includes a plurality of alignment marks 150 provided for making an alignment the wafer for manufacturing the circuit elements on the first surface whereby the alignment marks 150 are not subject to a planarization process performed thereon. In a preferred embodiment, the alignment marks 150 on the second surface are a plurality of phase grating marks for applying a zero mark technique thereon.

Therefore, the present invention provides a new alignment technique wherein the alignment accuracy is not affected by the chemical and mechanical polishing processes (CMP) applied for planarization of the wafer surface and various layers formed thereon such that wafer alignment with high level of precision can be achieved thus enabling those of ordinary skill in the art to overcome the difficulties and limitations encountered in the prior art. Specifically, a new wafer alignment technique is disclosed by providing an optical system for detecting the alignment marks formed on the backside of the wafer and directing the reflecting beam from these marks to the alignment detector such that wafer alignment can be synchronously performed without being affected by surface topology changes made to the front surface of the wafer as results of various manufacturing processes performed thereon. Since the alignment beam is now projected on the alignment marks disposed on the backside of the wafer, very clear and non-obscured measurement of wafer alignment marks can be performed for high precision alignment without being affected by surface topology changes made to the front surface as results of various manufacturing processes. Furthermore, direct wafer alignment can be synchronously performed with a single light source to achieve high precision alignment by providing an optical system for detecting the alignment marks formed on the backside of the wafer and to simultaneously detect a corresponding set of alignment marks on a reticle and directing the beams from these two set of marks to the alignment detector. This single beam synchronous alignment operation is carried out without being affected by surface topology changes made to the front surface.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

I claim:

1. An alignment system for aligning a reticle with a semi-conductor wafer having a top surface and a bottom surface comprising:

a light source for projecting an alignment beam along an incident beam axis along a zero degree direction;

an alignment detector disposed above said reticle;

a beam splitter for reflect a portion of said alignment beam along an optical path of ninety degree relative to said incident beam axis to a plurality of reticle alignment marks disposed on a surface of said reticle for projecting a reticle-mark beam there-through to said alignment detector;

a wafer beam optical subsystem includes a plurality of reflectors for directing a portion of said alignment beam to irradiate onto said bottom surface of said wafer provided with a plurality of wafer alignment marks to reflect a wafer-mark beam from said alignment marks; and said wafer beam optical subsystem further constituting a wafer-mark beam optical path for guiding said wafer-mark beam reflected from said plurality of wafer marks back to said beam splitter for projecting to said alignment detector for carrying out an alignment.

2. The alignment system of claim 1 further comprising:

a transparent wafer chuck for holding said wafer and for transmitting said alignment beam through said transparent wafer chuck to irradiate onto said bottom surface with said alignment marks.

3. The alignment system of claim 2 wherein:

said wafer beam subsystem includes three plane reflectors wherein each reflector is provided for directing said alignment beam to a ninety degree direction change for directing said alignment beam to an optical path of ninety-degree relative to said incident beam axis directly below said wafer chuck to irradiate onto said bottom surface of said wafer having said plurality of wafer alignment marks.

4. An alignment system for aligning a reticle with a semi-conductor wafer having a top surface and a bottom surface comprising:

a light source for projecting an alignment beam along an incident beam axis along a zero degree direction;

an alignment detector disposed above said reticle;

a beam splitter for reflect a portion of said alignment beam along an optical path of ninety degree relative to said incident beam axis to a plurality of reticle alignment marks disposed on a surface of said reticle for projecting a reticle-mark beam through said reticle to said alignment detector;

a transparent wafer chuck disposed directly under said reticle for holding said wafer and for transmitting said alignment beam through said transparent wafer chuck to irradiate onto said bottom surface of said wafer having a plurality of alignment marks;

a wafer beam optical subsystem includes three plane reflectors wherein each reflector is provided for directing said alignment beam to a ninety degree direction change for directing said alignment beam to an optical path of ninety-degree relative to said incident beam axis directly below said wafer chuck to irradiate onto said bottom surface of said wafer with said plurality of wafer alignment marks; and said wafer beam optical subsystem further constituting a wafer-mark beam optical path for guiding said wafer-mark beam reflected from said plurality of alignment marks disposd on said bottom surface of said wafer back to said beam splitter for projecting to said alignment detector for carrying out an alignment.

5. A method for aligning a reticle with a semiconductor wafer having a top surface and a bottom surface comprising:

applying a light source and an optical system for directing an incident light beam to a plurality of reticle alignment marks on said reticle to project a reticle-mark beam to an alignment detector from said reticle;

applying said light source and said optical system for directing said incident light beam to irradiate onto said bottom surface of said wafer having a plurality of wafer alignment marks for projecting a wafer-mark beam from said alignment marks; and applying said optical system for directing said wafer-mark beam to said alignment detector for precisely aligning said reticle and said wafer.

6. The method for aligning a reticle with a semiconductor wafer of claim 5 wherein:

said step of applying said optical system for directing said reticle-mark beam and said wafer-mark beam to said alignment detector for precisely aligning said reticle and said wafer is a step of superimposing said wafer-mark beam onto said reticle-mark beam in said alignment detector for producing an alignment deviation signal for making alignment adjustments.

7. The method for aligning a reticle with a semiconductor wafer of claim 6 wherein:

said step of superimposing said wafer-mark beam onto said reticle-mark beam in said alignment detector for producing an alignment deviation signal for making alignment adjustments is step of applying a zero mark technique by superimposing said wafer-mark beam produced by a reflection from a set of phase-grating marks on said wafer on to a reticle-mark beam produced from said alignment beam passing through a set of corresponding phase-marks on said reticle.

* * * * *